United States Patent

Kawasaki et al.

[11] Patent Number: 5,900,765
[45] Date of Patent: May 4, 1999

[54] BIAS CIRCUIT

[75] Inventors: Hidetoshi Kawasaki; Takahiro Ohgihara, both of Kanagawa, Japan

[73] Assignee: Sony Corporation, Tokyo, Japan

[21] Appl. No.: 08/811,948

[22] Filed: Mar. 5, 1997

[30] Foreign Application Priority Data

Mar. 8, 1996 [JP] Japan ..................................... 9-079369
Mar. 8, 1996 [JP] Japan ..................................... 8-079370

[51] Int. Cl.$^6$ ....................................................... G06G 7/12
[52] U.S. Cl. ............................................................. 327/362
[58] Field of Search ...................................... 327/538–543, 327/564, 362

Primary Examiner—David B. Hardy
Attorney, Agent, or Firm—Ronald P. Kananen; Rader, Fishman & Grauer PLLC

[57] ABSTRACT

A transistor-bias voltage stabilizing circuit comprises a current saturating resistor connected in series to the output of an FET, the gate bias voltage of which is to be stabilized and a capacitor connected in parallel to the current saturating resistor. The transistor-bias voltage stabilizing circuit may comprise a voltage detecting circuit and a negative-feedback circuit connected between the input and output of an FET, the gate bias voltage of which is to be stabilized.

16 Claims, 6 Drawing Sheets

F I G. 2
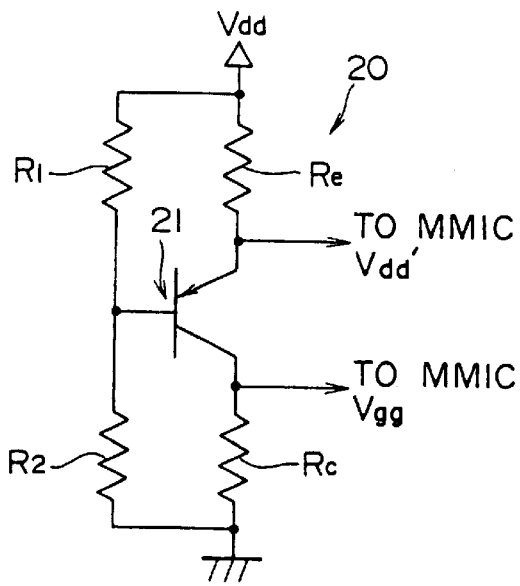
F I G. 3
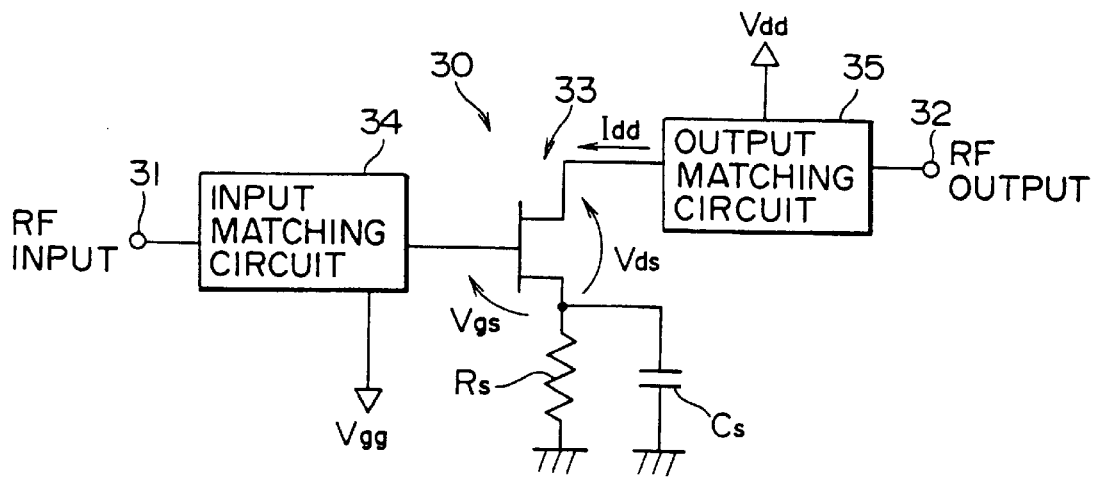
F I G. 4
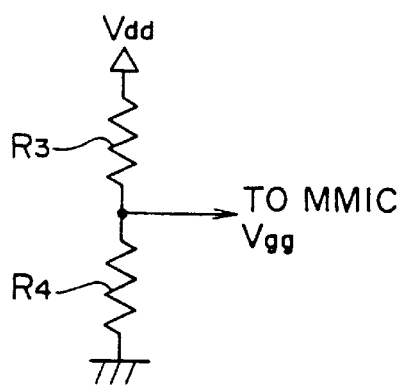

F I G. 10
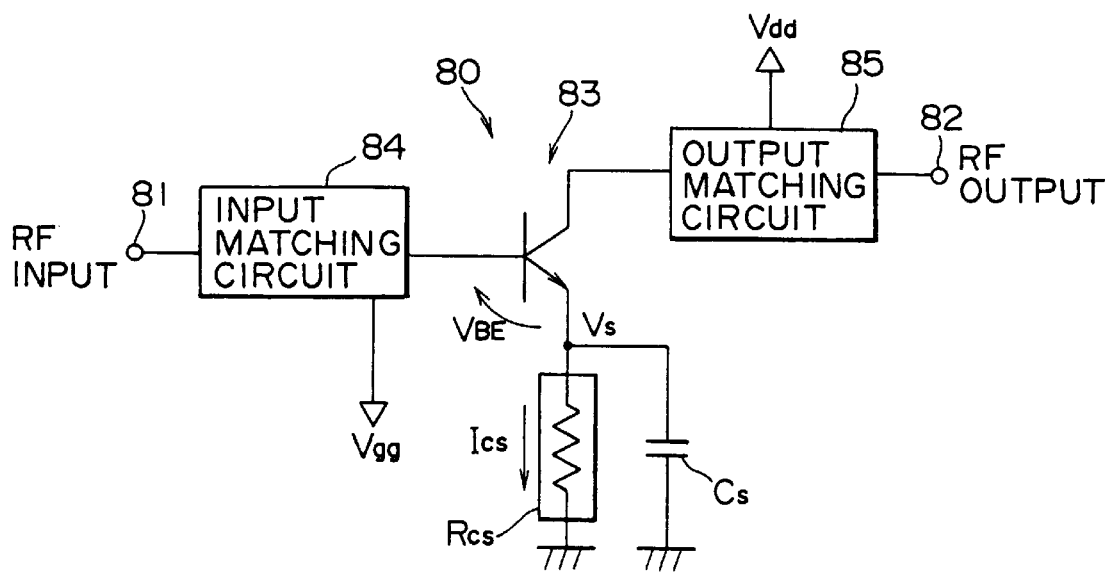

[US patent 5,900,765, columns 1-2]

BIAS CIRCUIT

BACKGROUND OF THE INVENTION

1. Field of the Invention

The present invention relates to a transistor-bias voltage stabilizing circuit for stabilizing the bias voltage of a field-effect transistor or a bipolar transistor employed in typically a monolithic microwave integrated circuit.

2. Description of the Prior Art

A monolithic microwave integrated circuit (referred to hereafter simply as an MMIC) employing a field-effect transistor (referred to hereafter simply as an FET) or a bipolar transistor made of a compound semiconductor such as gallium arsenide has an excellent frequency characteristic and generates only a small amount of noise. For these reasons, the MMIC is widely used in a mobile communication apparatus, a representative of high-frequency systems. Since how to make the characteristics of devices employed in such a high-frequency system uniform with ease is one key point for cost reduction, an adjustmentless feature of an integrated circuit (referred to hereafter simply as an IC) is desirable. From a standpoint of guaranteeing an operation time, that is, a standpoint of usage freedom, the assurance of stable characteristics of the IC against variations in power-supply voltage is indispensable.

Taking an MMIC employing an FET as an example, the adjustmentless feature of an IC and the assurance of stable characteristics of the IC against variations in power-supply voltage are explained by referring to FIGS. 1 to 4. FIG. 1 is a diagram showing the configuration of a representative circuit of a one-stage amplifier manufactured as an MMIC. As shown in the figure, the MMIC 10 comprises an input terminal 1 for receiving a radio-frequency (referred to hereafter simply as RF) input signal, an output terminal 2 for supplying an RF output signal to an external circuit, an FET 3 made of a compound semiconductor such as gallium arsenide, an input matching circuit 4 provided between the input terminal 1 and the gate of the FET 3 for obtaining a gain in a desired frequency band and input-impedance matching and an output matching circuit 5 provided between the output terminal 2 and the drain of the FET 3 for obtaining a gain in a desired frequency band and output-impedance matching. A voltage $V_{dd}'$ of a power supply is applied to the drain of the FET 3 by way of a portion of the output matching circuit 5. On the other hand, a direct-current gate bias voltage $V_{gg}$ is applied to the gate of the FET 3 by way of a portion of the input matching circuit 4.

In the case of the MMIC 10 shown in FIG. 1, the direct-current gate bias voltage $V_{gg}$ needs to be adjusted for each MMIC 10 in order to stabilize the IC operating current against variations in threshold voltage occurring in the FET 3 and, thus, to make the frequency characteristic of the IC uniform. For this reason, in the case of the related art, typically, a bias voltage-adjustment eliminating circuit 20 like the one shown in FIG. 2 is provided separately from the MMIC 10 on the circuit board on which the MMIC 10 is mounted.

As shown in FIG. 2, the bias voltage-adjustment eliminating circuit 20 comprises a PNP-type bipolar transistor 21, a resistor $R_1$, the terminals of which are connected to the base of the transistor 21 and a voltage $V_{dd}$ of the power supply respectively, a resistor $R_2$, the terminals of which are connected to the base of the transistor 21 and the ground respectively, a resistor Re, the terminals of which are connected to the emitter of the transistor 21 and the voltage $V_{dd}$ of the power supply respectively, and a resistor $R_c$, the terminals of which are connected to the collector of the transistor 21 and to the ground respectively. The emitter of the transistor 21 is connected to an input terminal of the MMIC 10 shown in FIG. 1 for receiving the voltage $V_{dd}'$ of the power supply in order to supply the voltage $V_{dd}'$ of the power supply to the MMIC 10. On the other hand, the collector of the transistor 21 is connected to the gate of the FET 3 shown in FIG. 1 in order to provide the direct-current gate bias voltage $V_{gg}$ to the FET 3.

The bias voltage-adjustment eliminating circuit 20 shown in FIG. 2 stabilizes the bias voltage of the FET 3 by feeding back a voltage drop along the resistor $R_e$. With this bias voltage-adjustment eliminating circuit 20, the voltage drop along the resistor $R_e$ increases when the drain current of the FET 3 increases. As a result, the collector potential of the transistor 21, that is, the direct-current gate bias voltage $V_{gg}$ of the MMIC 10 goes down, suppressing the increase in drain current occurring in the FET 3.

However, the bias voltage-adjustment eliminating circuit 20 shown in FIG. 2 which is provided on the circuit board separately from the MMIC 10 gives rise to a problem that the number of components increases and the area for mounting components on the circuit board becomes larger.

In order to solve this problem, an MMIC 30 with a configuration adopting a self-bias voltage technique like the one shown in FIG. 3 is thought of. As shown in the figure, the MMIC 30 is the MMIC 10 shown in FIG. 1 wherein the source of the FET 3 is connected to the ground through a circuit comprising a resistor $R_s$ and a by-pass capacitor $C_s$ which are connected to each other in parallel. It should be noted, however, that the voltage $V_{dd}$ is used directly as a power-supply voltage of the MMIC shown in FIG. 3. Let us assume that the direct-current gate bias voltage $V_{gg}$ supplied to the MMIC 30 is fixed. The drain current $I_{dd}$ may vary from FET to FET due to variations in threshold voltage $V_{th}$ thereof. Since a negative feedback is added to the voltage $V_{gs}$ between the source and the gate of the FET 3, however, the change in drain current can be reduced in comparison with that occurring in the MMIC 10 shown in FIG. 1 without the bias voltage-adjustment eliminating circuit 20 shown in FIG. 2.

It should be noted, however, that the circuit shown in FIG. 3 has the following shortcoming. That is to say, the presence of the resistor $R_s$ reduces the voltage $V_{ds}$ between the source and the drain of the FET 3. Therefore, if the resistance of the resistor $R_s$ is increased in order to increase the stability of the drain current $I_{dd}$, the decrease in voltage $V_{ds}$ between the source and the drain also becomes greater, giving rise to a problem that it is feared that the frequency characteristic of the FET 3 changes accordingly. It is thus obvious that there is a tradeoff between maintaining the voltage $V_{ds}$ between the source and the drain of the FET 3 and increasing the stability of the drain current $I_{dd}$. As a result, it is thus impossible to completely eliminate fluctuations in drain current $I_{dd}$.

A circuit shown in FIG. 4 is used as a circuit for generating the direct-current gate bias voltage $V_{gg}$ of an FET 33 employed in the MMIC 30 shown in FIG. 3. As shown in FIG. 4, the circuit comprises a resistor $R_3$, one end of which is connected to the voltage $V_{dd}$ of the power supply, and a resistor $R_4$, the terminals of which are connected to the other end of the resistor $R_3$ and the ground respectively. The connection point between the resistors $R_3$ and $R_4$ is connected to the gate of the FET 33 shown in FIG. 3, supplying the direct-current gate bias voltage $V_{gg}$ to the gate of the FET 33. If the bias voltage adjustment is eliminated by supplying the direct-current gate bias voltage $V_{gg}$ generated by the circuit shown in FIG. 4 to the gate of the FET 33, however, fluctuations in power-supply voltage $V_{dd}$ result in variations in direct-current gate bias voltage $V_{gg}$. As a result, it is more difficult to stabilize the drain current $I_{dd}$.

As described above, in order to implement an MMIC that is not affected by changes in drain current $I_{dd}$ due to variations in FET characteristics and fluctuations in power-supply voltage, an externally added component must be added. An MMIC having an adjustmentless feature without using an external component has not been reported so far.

OBJECTS AND SUMMARY OF THE INVENTION

It is thus a first object of the present invention to provide a transistor-bias voltage stabilizing circuit which needs neither externally added components nor adjustment but is yet capable of stabilizing a bias voltage supplied to a transistor without being affected by variations in device characteristics and fluctuations in power-supply voltage.

It is a second object of the present invention to provide a transistor-bias voltage stabilizing circuit which can be embedded in an IC along with a transistor, the gate bias voltage of which is to be stabilized, and does not have an output matching circuit embedded in the IC but allows the output matching circuit to be added as an external component so that there is no need to increase the number of IC pins.

To put the first object provided by the present invention in more detail, the transistor-bias voltage stabilizing circuit provided by the present invention has a current saturating resistor connected in series to the source and the drain or the emitter and the collector of the transistor, a gate bias voltage of which is to be stabilized, for making the current flowing through the current saturating resistor saturated for a voltage applied to the resistor exceeding a predetermined value.

With the current saturating resistor employed in this transistor-bias voltage stabilizing circuit, the current of the circuit can be kept at a constant value without regard to variations in device characteristic and fluctuations in power-supply voltage.

The transistor-bias voltage stabilizing circuit provided as a second object of the present invention comprises a first resistor for detecting a voltage drop caused by a bias voltage current flowing through the first resistor with one terminal thereof connected to a power supply and its other terminal connected to an electrode on the signal-output side of the transistor, a gate bias voltage of which is to be stabilized, an active element for adding the voltage drop along the first resistor to a bias voltage applied to the transistor, the gate bias voltage of which is to be stabilized, as a negative feedback and a second resistor provided between the electrode connected to the first resistor on the signal-output side of the transistor, the gate bias voltage of which is to be stabilized, and the active element.

In the transistor-bias voltage stabilizing circuit as the second object of the present invention, the active element is used for adding the voltage drop along the first resistor to a bias voltage applied to the transistor, the gate bias voltage of which is to be stabilized, as a negative feedback so as to make the bias voltage of the transistor stabilized. In the transistor-bias voltage stabilizing circuit, by providing a second resistor between the electrode connected to the first resistor on the signal-output side of the transistor, the gate bias voltage of which is to be stabilized, and the active element, the first resistor can be connected directly to the electrode on the signal-output side of the transistor, the gate bias voltage of which is to be stabilized. The direct connection, in turn, allows an output matching circuit to be connected as an external component without increasing the number of pins in comparison with an IC with an output matching circuit embedded therein.

BRIEF DESCRIPTION OF THE DRAWINGS

The above and other objects, features as well as many of attendant advantages of the present invention will be readily appreciated as the same becomes better understood by reference to the following figures showing the embodiments of the present invention wherein:

FIG. 2 is a circuit diagram showing the configuration of a bias voltage-adjustment eliminating circuit according to the related art;

FIG. 3 is a circuit diagram showing th e configuration of an MMIC adopting a self-bias voltage technique;

FIG. 4 is a circuit diagram showing the configuration of a circuit for generating a direct-current gate bias voltage to be applied to the circuit shown in FIG. 3;

FIG. 10 is a circuit diagram showing the configuration of an MMIC including a transistor-bias voltage stabilizing circuit provided by a second embodiment of the present invention;

DETAILED DESCRIPTION OF THE PREFERRED EMBODIMENTS

The present invention will become more apparent from the following detailed description of some preferred embodiments with reference to the accompanying diagrams showing the embodiments.

Figure 1:
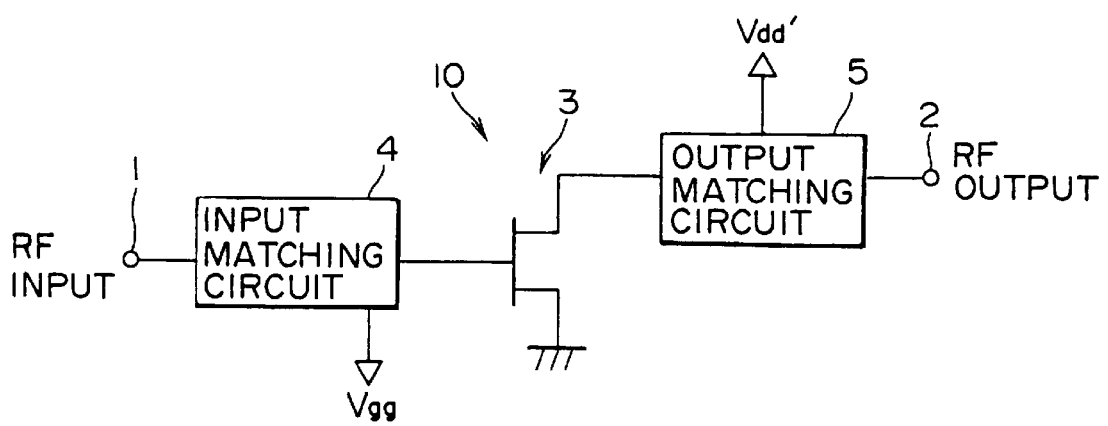
FIG. 1 is a circuit diagram showing the configuration of a representative circuit of a one-stage amplifier manufactured as an MMIC in accordance with the related art.
Figure 5:
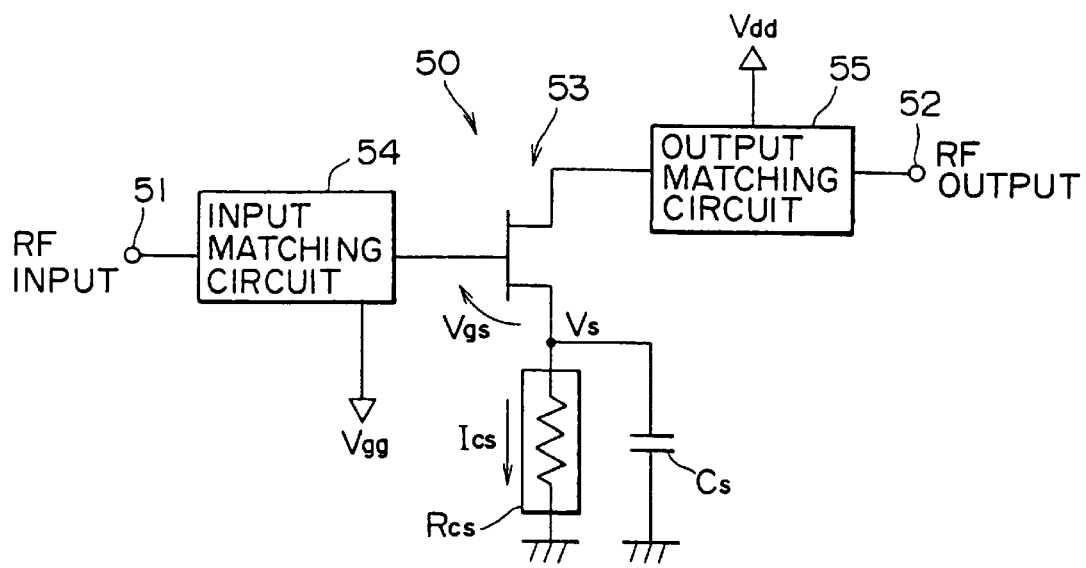
FIG. 5 is a circuit diagram showing the configuration of an MMIC including a transistor-bias voltage stabilizing circuit provided by a first embodiment of the present invention.

FIG. 5 is a circuit diagram showing the configuration of an MMIC serving as a one-stage amplifier which includes a transistor-bias voltage stabilizing circuit provided by a first embodiment of the present invention. As shown in the figure, the MMIC 50 comprises an input terminal 51 for receiving an RF input signal, an output terminal 52 for supplying an RF output signal to an external circuit, an FET 53 made of a compound semiconductor such as gallium arsenide, an input matching circuit 54 provided between the input terminal 51 and the gate of the FET 53 for obtaining a gain in a desired frequency band and input-impedance matching and an output matching circuit 55 provided between the output terminal 52 and the drain of the FET 53 for obtaining a gain in a desired frequency band and output-impedance matching. The voltage $V_{dd}$ of a power supply is applied to the drain of the FET 53 by way of a portion of the output matching circuit 55. On the other hand, a direct-current gate bias voltage $V_{gg}$ is applied to the gate of the FET 53 by way of a portion of the input matching circuit 54. The source of the FET 53 is connected to the ground through a circuit comprising a current saturating resistor $R_{cs}$ and a by-pass capacitor $C_s$ which are connected to each other in parallel. In actuality, the FET 53 is implemented by a MESFET (metal-semiconductor-junction FET) or a JFET (a PN-junction FET).

Figure 6:
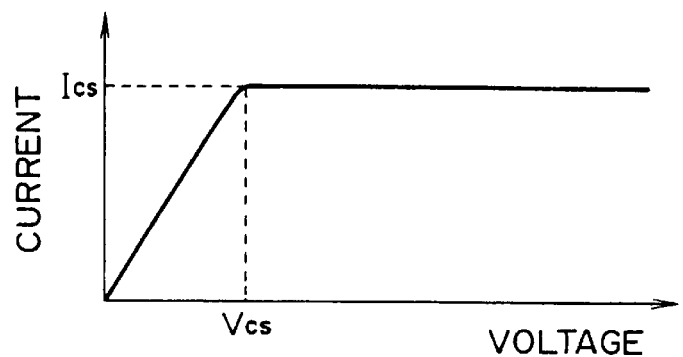
FIG. 6 is a diagram showing the voltage-current characteristic of a current saturating resistor employed in the transistor-bias voltage stabilizing circuit shown in FIG. 5.

FIG. 6 is a diagram showing the voltage-current characteristic of the current saturating resistor $R_{cs}$ employed in the transistor-bias voltage stabilizing circuit shown in FIG. 5. As shown in FIG. 6, the current flowing through the current saturating resistor $R_{cs}$ increases proportionally with a voltage applied thereto till the applied voltage reaches a predetermined voltage $V_{cs}$. As the voltage applied to the current saturating resistor $R_{cs}$ exceeds the voltage $V_{cs}$, however, the current gets saturated, remaining at an all but constant value. The voltage $V_{cs}$ is referred to hereafter as a saturation voltage. The current which gets saturated at an all but fixed value is referred to hereafter as a saturation current Ics. The characteristic like the one shown in FIG. 6 is observed in a compound semiconductor of the gallium-element group such as GaAs and AlGaAs/GaAs (a hetero junction between AlGaAs and GaAs). For this reason, the current saturating resistor $R_{cs}$ is normally made of a compound semiconductor of the gallium-element group such as GaAs and AlGaAs/GaAs even though another kind of compound semiconductor can of course be used as well. Let us take, GaAs, the most representative compound semiconductor of the gallium-element group, as an example. In this case, when the electric field in the electron traveling direction in the current saturating resistor $R_{cs}$ exceeds a value of about 3.5×10(3) V/cm, the electron traveling velocity gets saturated. The electric field at which the electron traveling velocity gets saturated is referred to hereafter as a current saturating electric field Ecs. This phenomenon is based on transition of electrons among semiconductor valleys caused by energy obtained from the electric field. The sudden velocity saturation occurs at a relatively weak electric field because the difference in energy between the semiconductor valleys is only 0.29 eV (at an absolute temperature of 300 degrees) which is a small value. The occurrence of the sudden velocity saturation is also attributed to the fact that the electron mobility at a weak electric field is high, resulting a good acceleration. Another cause of the occurrence of the sudden velocity saturation is the electron mobility in the semiconductor valley after the transition is extremely small in comparison with that prior to the transition. That is to say, the current saturating resistor $R_{cs}$ makes use of physical properties that are peculiar to GaAs and other semiconductors of the gallium-element group and not obtainable from silicon.

Figure 7:
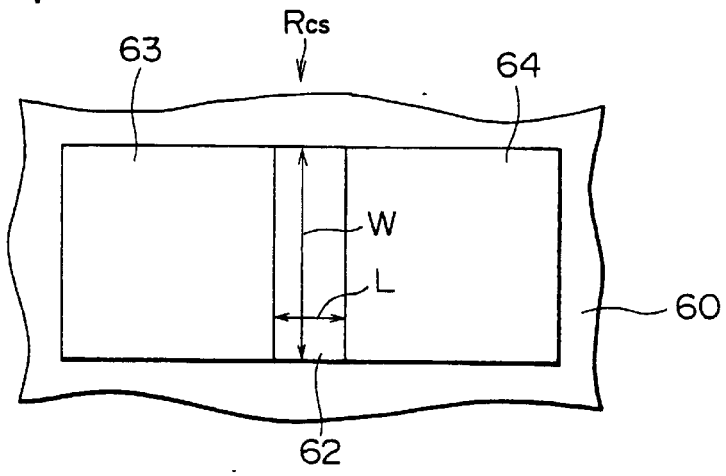
FIG. 7 is a plane diagram showing a typical device structure of a current saturating resistor made of gallium arsenide.
Figure 8:
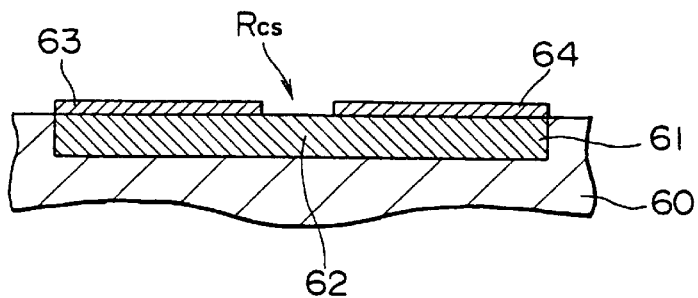
FIG. 8 is a diagram showing a cross section of the device structure of the current saturating resistor shown in FIG. 7.

FIG. 7 is a plane diagram showing a typical device structure of the current saturating resistor $R_{cs}$ made of gallium arsenide and FIG. 8 is a diagram showing a cross section of the device structure of the current saturating resistor $R_{cs}$ shown in FIG. 7. In the current saturating resistor $R_{cs}$ shown in these figures, a channel 61 made of an N-impurity layer is created on a semi-insulating GaAs substrate 60 in order to form a resistor layer 62. Ohmic electrodes 63 and 64 are joined on the channel 61 at positions sandwiching the resistor layer 62. The channel 61 is created typically by using the ion-injection or crystal-growth method. In the case of the embodiment shown in FIG. 8, the lower portions of the ohmic electrodes 63 and 64 on the channel 61 are each created as a layer having the same impurity concentration as the resistor layer 62 only for the sake of simplicity. It should be noted, however, that they can also each be created as a layer having an impurity concentration higher than that of the resistor layer 62. As described above, the device structure of the current saturating resistor $R_{cs}$ is the same as that of an ordinary resistor employed in the MMIC 50. As a result, an additional process is not required at all in order to create the current saturating resistor $R_{cs}$ in the MMIC 50.

Here, let notation $\rho_s$ denote the sheet resistance of the resistor layer 62, notation $R_c$ denote the ohmic contact resistance between ohmic electrodes 63 and 64 and the channel 61, notations W and L represent the width and the length of the resistor layer 62 between the ohmic electrodes 63 and 64 respectively as shown in FIG. 7 and the distribution of the electric field in the channel 61 be uniform. In this case, the relation between the saturation voltage $V_{cs}$ and the saturation current $I_{cs}$ is expressed by the following equation:

$$V_{cs} = E_{cs} \times L + R_c \times I_{cs}$$

$$I_{cs} = V_{cs} / \{(\rho_s \times L/W) + 2R_c\}$$

That is to say, the characteristic of the current saturating resistor $R_{cs}$ of the structure shown in FIGS. 7 and 8 is determined by the dimensions (W and L) of the device and the conditions of the process. Since variations in both $\rho_s$ and $R_c$ after the determination of the conditions are relatively small, however, the current saturating resistor $R_{cs}$ with a stable characteristic can be created.

Next, the operation of the MMIC 50 including the transistor-bias voltage stabilizing circuit provided by the present invention is explained.

Let the voltage $V_{dd}$ of the power supply in the circuit shown in FIG. 5 be sufficiently high. Now, let us assume that the direct-current gate bias voltage $V_{gg}$ is fixed. In the case of a small RF input signal, the current flowing to the circuit matches the saturation current $I_{cs}$ of the current saturating resistor $R_{cs}$ and a bias voltage is applied to the voltage $V_{gs}$ between the source and the gate of the FET 53 so that the current becomes the saturation current $I_{cs}$ without regard to how high the threshold voltage $V_{th}$ of the FET 53 is. Since the direct-current gate bias voltage $V_{gg}$ is fixed, the source potential $V_s$ of the FET 53 is determined in dependence upon the saturation current $I_{cs}$. In addition, even if the direct-current gate bias voltage $V_{gg}$ changes, the bias voltage point of the FET 53 is always set so that the current is kept at the saturation current $I_{cs}$ because the source potential $V_s$ of the FET 53 also varies with the change in direct-current gate bias voltage $V_{gg}$.

That is to say, if the condition $V_s \geq V_{cs}$ is satisfied, a constant current $I_{cs}$ always flows without being affected by variations in device characteristic such as the threshold voltage $V_{th}$ of the FET 53 and fluctuations in power-supply voltage. In the case of a large RF input signal, on the other hand, the magnitude of the current may deviate from the saturation current $I_{cs}$ depending upon the operating state of the FET 53. In this case, however, the change in current is absorbed by the by-pass capacitor $C_s$ installed in parallel to the current saturating resistor Rcs. As a result, the bias voltage point of the FET 53 is not dependent on the magnitude of the RF input signal.

Figure 9:
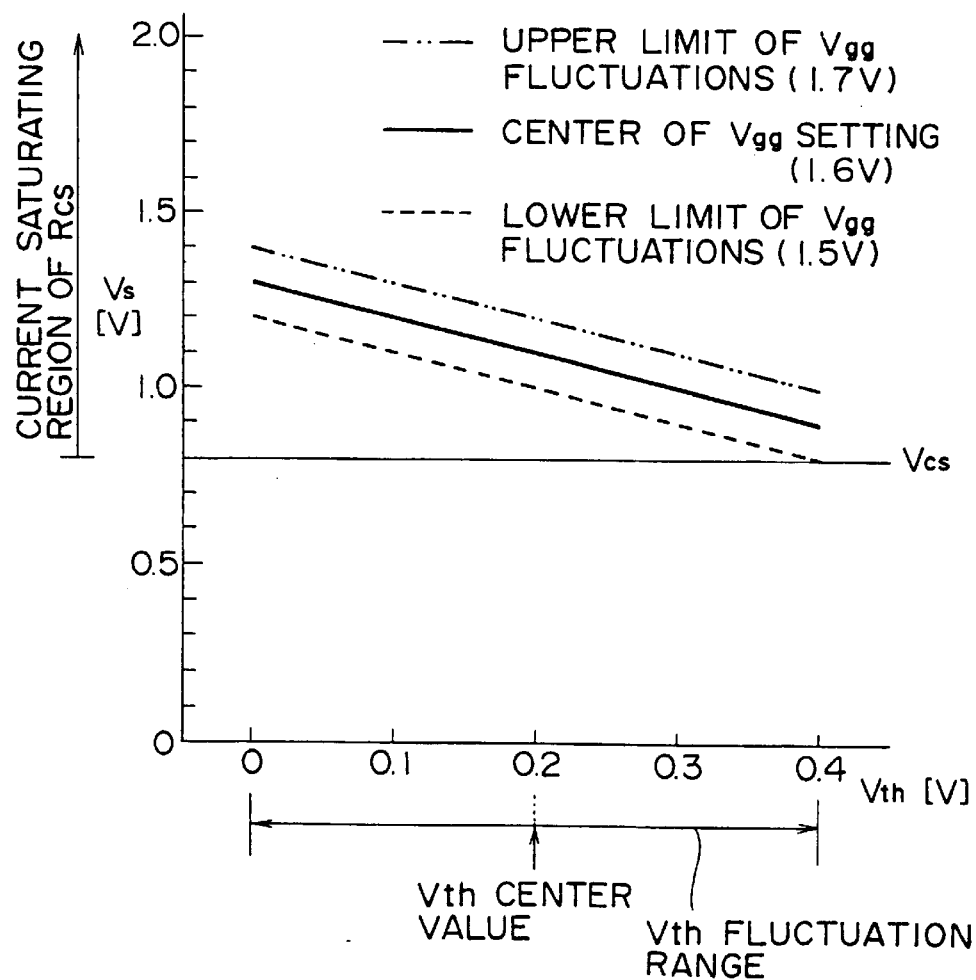
FIG. 9 is a characteristic diagram showing a typical relation between the threshold voltage and the source potential of an FET employed in the MMIC shown in FIG. 5.

Here, an implementation of the present embodiment is explained by referring to FIG. 9. FIG. 9 is a characteristic diagram showing a typical relation between the threshold voltage $V_{th}$ and the source potential $V_s$ of the FET 53 employed in the MMIC 50 shown in FIG. 5. In this implementation, $V_{dd}$=3V, $V_{cs}$=0.8V, $I_{cs}$=10 mA, the drain conductance of the FET 53 is made sufficiently small, that is, the drain current $I_{ds}$ in the drain-current saturation region of the FET 53 is determined by Vgs, and $V_{gs}$ (at $I_{gs}$=10 mA)−$V_{th}$=0.3V. In addition, it is quite within the bounds of possibility that the threshold voltage $V_{th}$ varies in the range ±0.2V with 0.2V taken as the center thereof. In general, the assumptions described above apply to an MMIC for mobile-communication applications. With $V_{gg}$ set at 1.6V, at $V_{th}$= 0V, $V_s$=1.3V and, at $V_{th}$=0.4V, $V_s$=0.9V as shown in FIG. 9, making it obvious that the condition $V_s \geq V_{cs}$ can be satisfied. In either case, the direct-current gate bias voltage $V_{gg}$ may decrease by 0.1V, that is, the direct-current gate bias voltage $V_{gg}$ may decrease to 1.5V, the lower limit of the variation in $V_{gg}$. Even if the source potential $V_s$ decreases by 0.1V following the decrease in $V_{gg}$, the condition $V_s \geq V_{cs}$ is still satisfied because $V_{cs}$ is equal to or higher than 0.8V. As a result, the current flowing through the current saturating resistor $R_{cs}$ is sustained at a constant value. It should be noted that, if the direct-current gate bias voltage $V_{gg}$ increases by 0.1V, that is, if the direct-current gate bias voltage $V_{gg}$ increases to 1.7V, the upper limit of the variation in $V_{gg}$, it is needless to say that the condition $V_s \geq V_{cs}$ is also satisfied as well.

As described above, according to the transistor-bias voltage stabilizing circuit provided by the present embodiment, the current saturating resistor $R_{cs}$ is connected in series to the source and drain of the FET 53 so that the bias voltage of the FET 53 can be stabilized without using an external component, without a need for adjustment and without being affected by variations in device characteristic and fluctuations in power-supply voltage. As a result, the costs of the IC and the set can be expected to decrease due to an increase in manufacturing yield and reduction in component count in addition to the expected enhancement of the degree of freedom to use the IC. On the top of that, the current saturating resistor $R_{cs}$ can be provided in the MMIC 50 without modifying the process of manufacturing the MMIC in accordance with the related art. In addition, since the by-pass capacitor $C_s$ is connected in parallel to the current saturating resistor $R_{cs}$, fluctuations in DC current caused by the RF input signal can be absorbed by the by-pass capacitor $C_s$.

While the present invention has been described with reference to a preferred embodiment of the disclosed circuit, this description is not intended to be construed in a limiting sense. It is further understood by those skilled in the art that a variety of changes and modifications can thus be made to the present embodiment. For example, the transistor, the gate bias voltage of which is to be stabilized, is not limited to an FET. Instead, the transistor-bias voltage stabilizing circuit can also be applied to a bipolar transistor as well.

Next, a second embodiment of the present invention is described.

To be more specific, a transistor-bias voltage stabilizing circuit applied to a bipolar transistor is explained.

In this case, a current saturating resistor $R_{cs}$ is connected in series to the emitter and collector of a bipolar transistor. An MMIC 80 shown in FIG. 10 is obtained from the MMIC shown in FIG. 5 by replacing the FET 3 employed therein by an NPN bipolar transistor 83. The collector of the NPN bipolar transistor 83 is connected to an output matching circuit 85 and the emitter thereof is connected to a circuit comprising a current saturating resistor $R_{cs}$ and a by-pass capacitor $C_s$ connected to each other in parallel. The base of the NPN bipolar transistor 83 is connected to an input matching circuit 84. Let notation $V_{BE}$ denote a difference in voltage between the base and the emitter of the NPN bipolar transistor 83. In this case, the direct-current gate bias voltage $V_{gg}$ is determined so as to satisfy a condition $V_{gg} \geq V_{BE}+V_{cs}$. In this way, the bias voltage of the NPN bipolar transistor 83 can be stabilized.

It should be noted that, while the present invention has been described with reference to the circuits shown in FIGS. 5 and 10, this description is not intended to be construed in a limiting sense. It is further understood by those skilled in the art that the present invention can also be applied to not only an MMIC, but also to circuits of other applications.

Next, a third embodiment of the present invention is explained.

Figure 11:
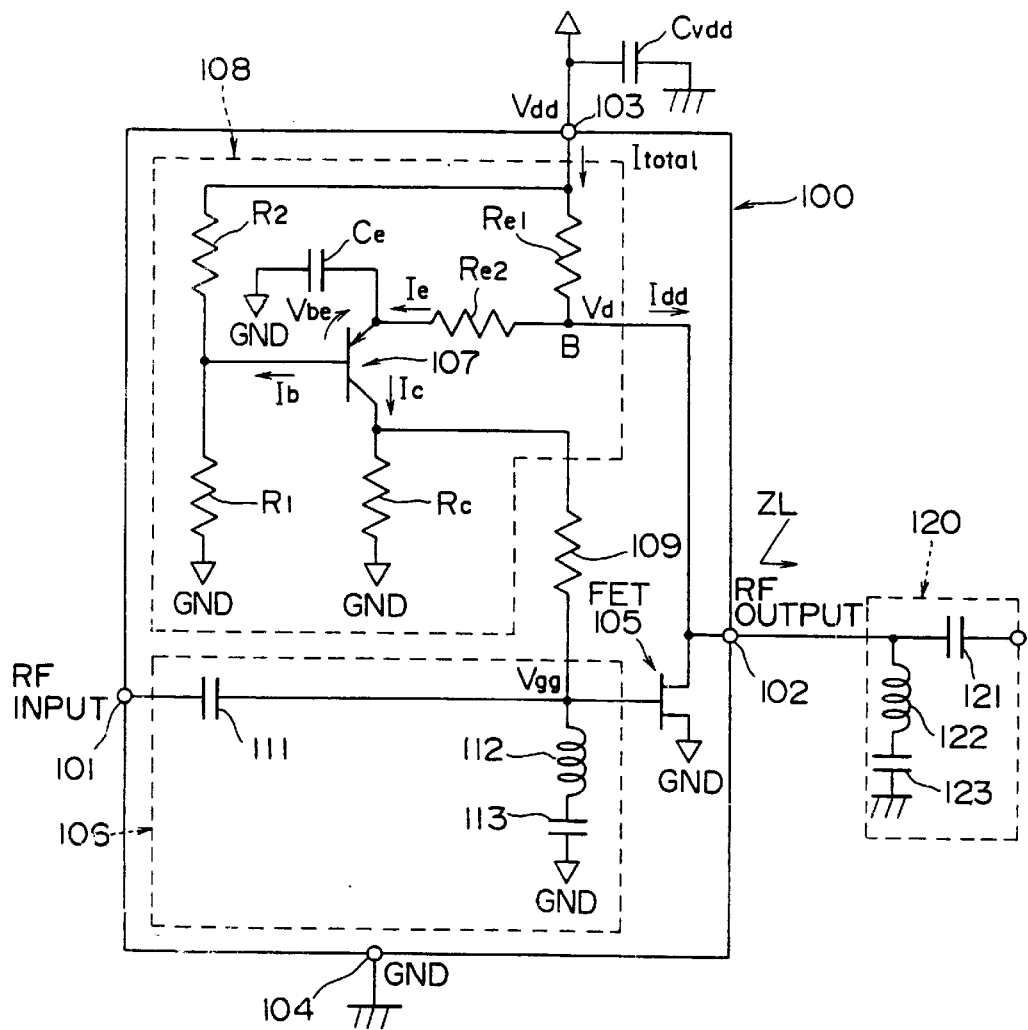
FIG. 11 is a circuit diagram showing the configuration of an MMIC including a transistor-bias voltage stabilizing circuit provided by a third embodiment of the present invention.

FIG. 11 is a circuit diagram showing the configuration of an MMIC of a one-stage amplifier including a transistor-bias voltage stabilizing circuit provided by a third embodiment of the present invention. Employing a single positive power supply, as shown in the figure, the MMIC 100 comprises an input terminal 101 for receiving an RF input signal, an output terminal 102 for supplying an RF output signal to an external circuit, a power-supply terminal 103, a ground terminal 104, an FET 105 made of a compound semiconductor such as gallium arsenide, an input matching circuit 106 provided between the input terminal 101 and the gate of the FET 105 for obtaining a gain in a desired frequency band and input-impedance matching, a bias voltage stabilizing circuit 108 provided between the power-supply terminal 103 and the drain of the FET 105 for stabilizing a bias voltage supplied to the FET 105 and a resistor 109 provided between the bias voltage stabilizing circuit 108 and the gate of the FET 105. The drain of the FET 105, an electrode on the signal-output side of the FET 105, is connected to the output terminal 102 and the source thereof is connected to the ground terminal 104. The power-supply terminal 103 is connected to the positive power supply and to the ground through a by-pass capacitor $C_{vdd}$ installed externally. The ground terminal 104 is connected to the ground. In actuality, the FET 105 is implemented by a MESFET (metal-semiconductor-junction FET) or a JFET (a PN-junction FET).

The input matching circuit 106 comprises a capacitor 111, the terminals of which are connected to the input terminal 101 and the gate of the FET 105 respectively, a coil 112, one terminal of which is connected to the gate of the FET 105 and a capacitor 113, the terminals of which are connected to the other terminal of the coil 112 and the ground terminal 104 respectively.

The bias voltage stabilizing circuit 108 comprises a resistor $R_{e1}$ serving as first resistor with one terminal thereof connected to the power-supply terminal 103 and its other terminal connected to the drain of the FET 105, a PNP bipolar transistor 107 serving as an active element for adding the voltage drop along the first resistor $R_{e1}$ to a bias voltage applied to the FET 105, the gate bias voltage of which is to be stabilized, as a negative feedback and a resistor $R_{e2}$ serving as a second resistor provided between the drain of the FET 105 connected to the first resistor $R_{e1}$ and the emitter of the transistor 107, a capacitor $C_e$ provided between the emitter of transistor 107 connected to the second resistor $R_{e2}$ and the ground terminal 104, a resistor $R_c$ connected between the collector of the transistor 107 and the ground terminal 104, a resistor $R_1$ connected between the base of the transistor 107 and the ground terminal 104 and a resistor $R_2$ connected between the base of the transistor 107 and the power-supply terminal 103. The collector of the transistor 107 is connected to one end of the resistor 109 and the gate of the FET 105 is connected to the other end of the resistor 109.

An external output matching circuit 120 is connected to the output terminal 102. The output matching circuit 120 comprises a capacitor 121 with one terminal thereof connected to the output terminal 102 of the MMIC 100 and its other terminal serving as an RF signal output pin, a coil 122 with one end thereof connected to the output terminal 102 of the MMIC 100 and a capacitor 123 connected between the other end of the coil 122 and the ground.

The MMIC 100 including the transistor-bias voltage stabilizing circuit provided by the present embodiment as described above is characterized in that:

the drain of the FET 105 is directly connected to the first resistor $R_{e1}$ for detecting a voltage drop along $R_{e1}$;

the second resistor $R_{e2}$ is inserted between the drain of the FET 105 connected to the first resistor $R_{e1}$ and the emitter of the transistor 107;

the capacitor $C_e$ is provided between the emitter of the transistor 107 connected to the second resistor $R_{e2}$ and the ground terminal 104; and as a result, no terminal for monitoring the voltage drop is required.

Here, the reason why, by providing the second resistor $R_{e2}$ and the capacitor $C_e$ as described above, a terminal for monitoring the voltage drop is no longer required is explained. In the first place, in order for an impedance seen from the drain of the FET 105 to serve as a desired impedance ZL implemented by the output matching circuit 120, nothing can not be connected to the drain of the FET 105 except an impedance sufficiently large in comparison with the impedance ZL. Let us call it a condition A.

In addition, in order to stabilize the bias voltage of the FET 105, the transistor-bias voltage stabilizing circuit 108 should not be affected by fluctuations in drain voltage of the FET 105, that is, high-frequency fluctuations of the output signal. Let us call it a condition B.

Assume, for example, that the resistor $R_{e2}$ and the capacitor $C_e$ are eliminated from the circuit shown in FIG. 11. The elimination of the resistor $R_{e2}$ and the capacitor $C_e$ is the same as directly connecting the drain of the FET 105 shown in FIG. 11 to the resistor $R_{e1}$ in the IC, providing the external output matching circuit 120 shown in FIG. 11 and eliminating the terminal for monitoring the voltage drop. In this case, an impedance seeing the transistor-bias voltage stabilizing circuit from the drain of the FET affects a total impedance seen from the drain of the FET, violating the condition A.

Even if the impedance seeing the transistor-bias voltage stabilizing circuit from the drain of the FET is sufficiently large, the direct connection of the drain of the FET to the transistor-bias voltage stabilizing circuit violates the condition B. In order to avoid the violation of the condition B, it becomes necessary to provide a ground capacitor like the capacitor $C_e$ on the drain side of the FET. As a result, the total impedance seen from the drain of the FET decreases substantially, giving rise to violation of the condition A.

In the MMIC 100 including the transistor-bias voltage stabilizing circuit provided by the present invention, on the other hand, the total impedance seen from the drain of the FET 105 is a parallel impedance comprising the impedance ZL and a parallel resistance which further comprises the first and second resistors $R_{e1}$ and $R_{e2}$ provided that the capacitances of the capacitors $C_e$ and $C_{vdd}$ are sufficiently large. Normally, since the capacitor $C_e$ is inside the chip, its capacitance is about several picofarads while the capacitance of the capacitor $C_{vdd}$ has an appropriate value greater than that of the capacitor $C_e$. Thus, as is also indicated in the example described earlier, by setting the resistance values of the first and second resistors $R_{e1}$ and $R_{e2}$ at several hundreds to several thousands of ohms, the parallel resistance of the first and second resistors $R_{e1}$ and $R_{e2}$ does not greatly affect the impedance ZL. That is to say, the condition A is satisfied. In some cases, however, the parallel resistance of the first and second resistors $R_{e1}$ and $R_{e2}$ reduces the gain of the MMIC 100. In addition, the condition B is also satisfied because the second resistor $R_{e2}$ and the capacitor $C_e$ are provided between the drain of the FET 105 and the emitter of the transistor 107. As described above, in the transistor-bias voltage stabilizing circuit 108 provided by the present invention, by providing the second resistor $R_{e2}$ and the capacitor $C_e$, the conditions A and B are both satisfied and, at the same time, the terminal for monitoring the voltage drop can be eliminated.

Next, the operation of the transistor-bias voltage stabilizing circuit 108 provided by the present embodiment is explained. To begin with, as shown in FIG. 11, let notation $V_{dd}$ denote the voltage of the power supply, notation $I_{total}$ denote a current flowing through the power-supply terminal 103, notation $V_d$ denote a voltage at a point B, a point of junction between the first and second resistors $R_{e1}$ and $R_{e2}$, notation $I_{dd}$ denote a current flowing from the point B to the drain of the FET 105, notation $I_e$ denote the emitter current of the transistor 107, notation $I_b$ denote the base current, notation $I_c$ denote the collector current, notation $V_{BE}$ denote a diffusion potential between the base and the emitter and notation $V_{gg}$ denote the direct-current gate bias voltage of the FET 105. It should be noted that, as general usage conditions of the MMIC 100, the positive direct-current gate bias voltage of the FET 105 is lower than the gate forward-direction turn-on voltage of the FET 105 so as to generate a sufficiently small gate current. As a result, the collector voltage of the transistor 107 also becomes equal to $V_{gg}$.

Under the conditions described above, the following relational equations a6 to a8 hold true of the transistor-bias voltage stabilizing circuit 108. It should be noted that, in the following relational equations a6 to a8, notations $R_1$, $R_2$, $R_{e1}$, $R_{e2}$ and $R_c$ denote the resistances of the resistors $R_1$, $R_2$, $R_{e1}$, $R_{e2}$ and $R_c$ respectively.

$$V_{dd}-V_d=(I_{dd}+I_e)\times R_{e1} \tag{a6}$$

$$V_{dd}-V_d=(I_{total}-I_e-I_{dd})\times R_2-V_{be}-I_cR_{e2} \tag{a7}$$

$$V_{dd}=(I_{total}-I_e-I_{dd})\times R_2+(I_{total}-I_e-I_{dd}+I_b)\times R_1 \tag{a8}$$

Eq. a6 is an equation expressing the voltage drop ($V_{dd}-V_d$) along the first resistor $R_{e1}$ (that is, along the resistance $R_1$) and Eq. a7 is an equation expressing the voltage drop ($V_{dd}-V_d$) along the second resistor $R_{e2}$ (that is, along the resistance $R_2$). On the other hand, Eq. a8 is an equation expressing that the sum of the voltage drops along the first and second resistors $R_{e1}$ and $R_{e2}$ (that is, along the resistances $R_1$ and $R_2$) is equal to the voltage $V_{dd}$ of the power supply.

Then, $V_d$ and $I_{total}$ are eliminated from Eqs. a6 to a8. Fist of all, Eq. a9 is derived from Eq. a8.

$$(I_{total}-I_e-I_{dd})(R_1+R_2)=V_{dd}-I_bR_1 \therefore I_{total}-I_e-I_{dd}=(V_{dd}-I_bR_1)/(R_1+R_2) \tag{a9}$$

From Eqs. a6 to a9, the following equation holds true.

$$(V_{dd} - I_b R_1)R_2/(R_1 + R_2) - V_{be} - I_e R_{e2} = I_{dd} R_{e1} + I_e R_{e1}$$
$$= I_{dd} R_{e1} + (I_b + I_c)R_{e1} (\because I_e = I_b + I_c)$$

Since $I_b = I_c/h_{fe}$ where $h_{fe}$ is a DC current amplification factor, the above equation can be rewritten into the following:

$$R_2 V_{dd}/(R_1 + R_2) - \{R_1 R_2/(R_1 + R_2)\} \times (1/h_{fe}) \times I_c - V_{be} - \quad (a10)$$
$$(I_c/h_{fe}) \times R_{e2} - I_c R_{e2} = I_{dd} R_{e1} + (R_{e1}/h_{fe}) \times I_c + I_c R_{e1}$$
$$\therefore I_c = [R_2 V_{dd}/(R_1 + R_2) - V_{be} - R_{e1} I_{dd}]/$$
$$[R_{e1} + R_{e2} + (1/h_{fe})\{R_{e1} + R_{e2} + R_1 R_2/(R_1 + R_2)\}]$$

Since the impedance of the resistor 109 is higher than the collector of the transistor 107, $V_{gg} = R_c I_c$. Substitution of Eq. a10 to $V_{gg} = R_c I_c$ yields Eqs. 5 to 7 given below. A characteristic representing a relation between the gate voltage and the drain current expressed by Eqs. 5 to 7 is shown in a curve 131 in FIG. 12.

$$I_{dd} = -p V_{gg} + q \quad (5)$$
$$p = [R_{e1} + R_{e2} + (1/h_{fe})\{R_{e1} + R_{e2} + R_1 R_2/(R_1 + R_2)\}]/R_c R_{e1} \quad (6)$$
$$q = [R_2 V_{dd}/(R_1 + R_2) - V_{be}]/R_{e1} \quad (7)$$

The drain current $I_{dd}$ of the FET 105 is approximated by a characteristic equation $I_{dd} = k(V_{gg} - V_{th})^2$. It should be noted that, in this case, notation $V_{th}$ denotes the threshold value of the FET 105 and notation k is the gate length of the FET 105, a constant determined by the electron mobility and the capacitance of the gate. The characteristic expressed by Eq. 4 is represented by a curve 132 shown in FIG. 12.

Figure 12:
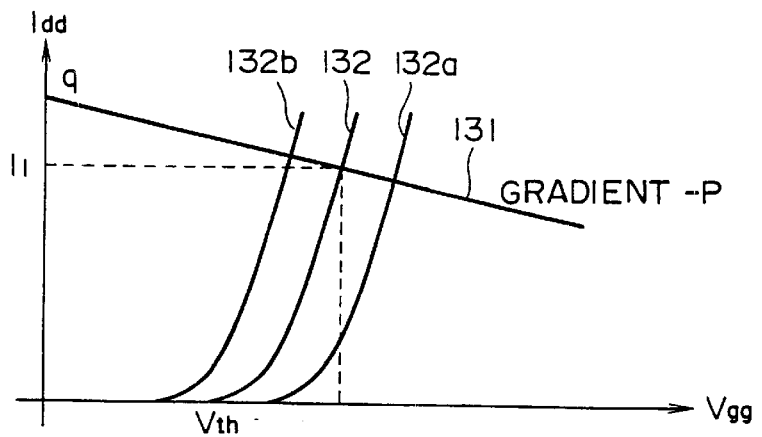
FIG. 12 is a diagram showing a characteristic representing the relation between the gate voltage and the drain current of an FET employed in the MMIC shown in FIG. 11.

The drain current $I_{dd}$ obtained actually is a current I1 at the intersection point of characteristic lines 131 and 132 shown in FIG. 12. Thus, in order to reduce changes in $I_{dd}$ due to variations in threshold voltage $V_{th}$ of the FET 105, it is necessary to decrease the gradient −p in Eq. 5 to as small a value as possible. For example, if the resistances of the resistors $R_1$, $R_2$, $R_{e1}$, $R_{e2}$ and $R_c$ and the DC current amplification factor $h_{fe}$ are selected so as to give a gradient p of the order of $10^{-4}$, the changes in $I_{dd}$ can be reduced to small values of about several hundreds of microamperes even if the variations in $V_{th}$ are in a 1V range.

Here, an implementation of the present example is explained. In the implementation, a noiseless amplifier is thought of wherein $R_1 = 5.3$ KΩ, $R_2 = 14.7$ KΩ, $R_{e1} = 500$Ω, $R_{e2} = 1$ KΩ, $R_c = 10$ KΩ, $h_{fe} = 10$, $V_{dd} = 3$V and $I_{dd}$ is about 2 mA. It is quite within the bounds of possibility that the threshold voltage $V_{th}$ fluctuates in the range ±0.2V with 0.3 V taken as the center thereof. In general, the assumptions described above apply to an MMIC for mobile-communication applications. The amount of current consumed by the transistor-bias voltage stabilizing circuit 108 is of the order of several tens of microamperes, a value small enough in comparison with $I_{dd}$. On the assumptions described above, from Eq. 6, the gradient p is found to be about $4.08 \times 10^{-4}$ and it is obvious that fluctuations in $I_{dd}$ are about 82 microamperes for fluctuations in threshold voltage $V_{th}$ in the range ±0.2V. As a result, it is also obvious that the MMIC 100 shown in FIG. 11 is capable of maintaining the excellent current stability and allows an external output matching circuit to be installed without increasing the number of IC pins.

According to the transistor-bias voltage stabilizing circuit 108 provided by the present embodiment as described above, the MMIC 100 has four pins, that is, the input terminal 101, the output terminal 102, the power-supply terminal 103 and the ground terminal 104. The transistor-bias voltage stabilizing circuit 108 is embedded therein but the output matching circuit 120 is not. However, it is possible to implement the MMIC 100 that allows an external output matching circuit 120 to be installed without the need to increase the number of pins over that of an MMIC with an output matching circuit embedded therein.

As a result, the MMIC 100 can be put in a four-pin package much like an MMIC with an output matching circuit embedded therein, allowing the package cost of the IC to be decreased and the mounting area on the substrate of the IC to be reduced as well.

It should be noted that, while the present invention has been through preferred embodiments, this description is not intended to be construed in a limiting sense. It is further understood by those skilled in the art that a variety of changes and modifications can thus be made to the present invention without departing from the true spirit and the scope thereof. For example, the transistor, the gate bias voltage of which is to be stabilized, is not limited to an FET and a bipolar transistor. In addition, the configuration of the transistor-bias voltage stabilizing circuit is not limited to the one shown in FIG. 11. A resistor can be provided between the transistor, the gate bias voltage of which is to be stabilized, and the power supply and a voltage drop along the resistor can then be added to the bias voltage as a negative feedback by an active element in order to stabilize the bias voltage. Also, the circuit including the transistor, the gate bias voltage of which is to be stabilized, is not limited to the one-stage amplifier implemented by the FET 105 shown in FIG. 11. Last but not least, the present invention can be applied not only to an MMIC but also to circuits of other applications as well.

As described above, the transistor-bias voltage stabilizing circuit provided by the present invention has a current saturating resistor connected in series to the source and the drain or the emitter and the collector of the transistor, a gate bias voltage of which is to be stabilized, for making the current flowing through the current saturating resistor saturated for a voltage applied to the resistor exceeding a predetermined value. As a result, the bias voltage of the transistor can be stabilized without using an external component, without a need for adjustment and without being affected by variations in device characteristic and fluctuations in power-supply voltage.

In addition, in the transistor-bias voltage stabilizing circuit, the first resistor connected directly to the electrode on the signal-output side of the transistor, the gate bias voltage of which is to be stabilized, is provided along with the second resistor between the electrode connected to the first resistor on the signal-output side of the transistor, the gate bias voltage of which is to be stabilized, and the active element. As a result, it is possible to provide an IC with a transistor-bias voltage stabilizing circuit embedded therein but without an embedded output matching circuit that allows an external output matching circuit to be installed without the need to increase the number of pins over that of an IC with an output matching circuit embedded therein.

What is claimed is:

1. A transistor-bias voltage stabilizing circuit having a current saturating resistor connected in series to a source and a drain or an emitter and a collector of a transistor, a gate bias voltage of which is to be stabilized, wherein a current flowing through said current saturating resistor gets saturated when a voltage applied to said current saturating resistor exceeds a predetermined value.

2. A transistor-bias voltage stabilizing circuit according to claim 1 further having a by-pass capacitor connected in parallel to said current saturating resistor.

3. A transistor-bias voltage stabilizing circuit comprising:

a first resistor for detecting a voltage drop caused by a bias voltage current flowing through said first resistor with a first terminal thereof connected to a power supply and a second terminal connected to an electrode on a signal-output side of a transistor, a gate bias voltage of which is to be stabilized;

an active element for adding said voltage drop along said first resistor to said bias voltage applied to said transistor, said gate bias voltage of which is to be stabilized, as a negative feedback; and a second resistor provided between said electrode connected to said first resistor on said signal-output side of said transistor, said gate bias voltage of which is to be stabilized, and said active element.

4. A transistor-bias voltage stabilizing circuit according to claim 3 further having a capacitor wherein a first terminal thereof is connected to an end of said second resistor connected to said active element and a second terminal is connected to the ground.

5. A transistor-bias voltage stabilizing circuit according to claim 3 wherein said active element is a bipolar transistor.

6. A transistor-bias voltage stabilizing circuit according to claim 5 wherein said bipolar transistor is a PNP transistor.

7. A transistor-bias voltage circuit comprising:

a signal amplifying FET;

a current detecting circuit for detecting a bias voltage current flowing through said current detecting circuit with a first terminal thereof connected to a power supply and a second terminal connected to an electrode on a signal-output side of said signal amplifying FET;

an active element for adding said voltage drop at said current detecting circuit to a bias voltage applied to said signal amplifying FET, said gate bias voltage of which is to be stabilized, as a negative feedback; and a resistor provided between said electrode connected to said current detecting circuit on said signal-output side of said signal amplifying FET, said gate bias voltage of which is to be stabilized, and said active element.

8. A transistor-bias voltage circuit according to claim 7 further having a capacitor wherein a first terminal thereof is connected to an end of said resistor connected to said active element and a second terminal is connected to a ground.

9. A transistor-bias voltage circuit according to claim 7 wherein said active element is a bipolar transistor.

10. A transistor-bias voltage circuit according to claim 9 wherein said bipolar transistor is a PNP transistor.

11. A transistor-bias voltage circuit according to claim 10 wherein the emitter of said PNP transistor is connected to the ground through said capacitor.

12. A transistor-bias voltage circuit comprising:

a signal amplifying FET;

a first resistor for detecting a voltage drop caused by a bias voltage current flowing through said first resistor with a first terminal thereof connected to a power supply and a second terminal connected to an electrode on a signal-output side of said signal amplifying FET;

an active element for adding said voltage drop along said first resistor to said bias voltage applied to said signal amplifying FET, said gate bias voltage of which is to be stabilized, as a negative feedback; and a second resistor provided between said electrode connected to said first resistor on said signal-output side of said signal amplifying FET, said gate bias voltage of which is to be stabilized, and said active element.

13. A transistor-bias voltage circuit according to claim 12 further having a capacitor wherein one terminal thereof is connected to an end of said second resistor connected to said active element and its other terminal is connected to a ground.

14. A transistor-bias voltage circuit according to claim 12 wherein said active element is a bipolar transistor.

15. A transistor-bias voltage stabilizing circuit according to claim 14 wherein said bipolar transistor is a PNP transistor.

16. A transistor-bias voltage circuit according to claim 15 wherein the emitter of said PNP transistor is connected to the ground through said capacitor.

* * * * *